United States Patent [19]

Gochermann

[11] Patent Number: 4,975,133
[45] Date of Patent: Dec. 4, 1990

[54] APPARATUS FOR WELDING COMPONENTS TOGETHER WITH THE USE OF ULTRASOUND

[75] Inventor: Hans Gochermann, Holm, Fed. Rep. of Germany

[73] Assignee: Licentia Patent-Verwaltungs-GmbH, Frankfurt, Fed. Rep. of Germany

[21] Appl. No.: 159,439

[22] Filed: Feb. 18, 1988

Related U.S. Application Data

[63] Continuation of Ser. No. 432,378, Sep. 30, 1982, abandoned.

[30] Foreign Application Priority Data

Nov. 28, 1981 [DE] Fed. Rep. of Germany ....... 3147255

[51] Int. Cl.$^5$ .............................................. B29C 65/08
[52] U.S. Cl. ................................. 156/73.1; 156/580.2; 228/1.1; 228/110
[58] Field of Search .................. 156/73.1, 580.1, 580.2, 156/73.4; 228/1.1, 110; 74/155; 310/321, 322

[56] References Cited

U.S. PATENT DOCUMENTS

| | | | |
|---|---|---|---|
| 3,017,792 | 1/1962 | Elmore et al. | 74/155 |
| 3,054,309 | 9/1962 | Elmore et al. | 228/1.1 |
| 3,217,957 | 11/1965 | Jarvie et al. | 228/1.1 |
| 3,224,915 | 12/1965 | Balamuth et al. | 156/73.1 |
| 3,360,850 | 1/1968 | Avila | 228/1.1 |
| 3,455,015 | 7/1969 | Daniels et al. | 228/1.1 |
| 3,737,361 | 6/1973 | Obeda | 156/580.1 |
| 3,955,740 | 5/1976 | Shoh | 228/1.1 |
| 4,333,791 | 6/1982 | Onishi | 156/580.1 |

FOREIGN PATENT DOCUMENTS

| | | |
|---|---|---|
| 2210855 | 9/1972 | Fed. Rep. of Germany . |
| 2219290 | 1/1974 | Fed. Rep. of Germany . |
| 2251521 | 4/1974 | Fed. Rep. of Germany ... 156/580.1 |

OTHER PUBLICATIONS

J. B. Jones et al., "Ultrasonic Welding", Published in Aircraft Production, (Dec., 1958), pp. 492–495.

*Primary Examiner*—Michael Wityshyn
*Attorney, Agent, or Firm*—Spencer & Frank

[57] ABSTRACT

An apparatus for receiving components having overlapping surfaces and welding the components together with the use of ultrasound. An ultrasound emitter receives a high frequency current and converts it into mechanical ultrasonic vibrations having the same frequency. A transmitter transmits the ultrasonic vibrations to a sonotrode which focuses the ultrasonic vibrations on the components to be welded together. The sonotrode is provided with a circumferential collar and means are provided for lowering the collar during the welding process so that a part of the collar tangentially contacts the overlapping surface of one of the components. The part of the collar which tangentially contacts the overlapping surface introduces ultrasonic energy into the components. The ultrasonic emitter, transmitter and sonotrode are rotatably mounted via a vibration node of the transmitter. Means are provided for rotation of the sonotrode and movement of the sonotrode relative to the components such that the collar rolls over the components during the welding process.

16 Claims, 2 Drawing Sheets

APPARATUS FOR WELDING COMPONENTS TOGETHER WITH THE USE OF ULTRASOUND

This application is a continuation of application Ser. No. 06/432,378, filed Sept. 30, 1982, now abandoned.

BACKGROUND OF THE INVENTION

The present invention relates to an apparatus for welding components together with the use of ultrasound, and particularly to an apparatus which employs a sonotrode to focus mechanical ultrasonic vibrations on the components to be welded.

Ultrasonic welding of contact materials, for example, the welding of silver and silver alloys onto substrates of copper and copper alloys, as well as aluminum, by means of ultrasound has been known in the art for some time (see, for example, "Zeitschrift ür Werkstofftechnik" [Journal of Material Technology], Volume 6, No. 4, 1975, pages 125–137). Ultrasonic welding employs a combination of friction and cold pressure welding applied at overlapped surfaces of parts to be welded together. A certain contact pressure is assumed to exist during ultrasonic welding. With the simultaneous application of contact pressure forces and ultrasonic energy, the required forces, and consequently also the developing deformation at the parts being welded, are reduced in an advantageous manner.

Due to high frequency frictional vibrations, which are the local effect of ultrasonic energy, the oxide layers and other impurities existing at the surfaces of the materials are destroyed without incurring noticeable plastic deformation in the region of the weld. The thus purified metal surfaces weld together at relatively low pressure due to the presence of metallic bonding forces.

One principle of the ultrasonic welding machine is described on page 127 of the above-identified reference. Ultrasonic welding devices basically include a high frequency generator (frequency converter), a sonic head (vibration converter), a sonotrode (vibration conductor), a machine frame to accommodate the parts to be welded and operating elements. The oscillations of high frequency current generated by the high frequency generator are converted into mechanical vibrations by a so-called sonic head which acts as an electroacoustical transducer. The electrical high frequency oscillations furnished by the high frequency generator are thus converted to mechanical vibrations at the same frequency. The sonotrode amplifies the vibrations and transmits them to the material to be welded.

An ultrasonic metal welding machine made by TELSONIC/ Switzerland (Model MSM-700, brochure dated July, 1977) is used to connect different types of materials if their hardness differences are not too great. For example, it can be used to connect shaped aluminum foils of electrolyte capacitor windings to a housing or to contact members, or to connect coil ends of electrical instruments, or to weld aluminum foils. All important welding parameters, such as vibration amplitude, pressure, welding time, delay time, holding time and recarriage advance can be varied with accuracy.

It is also known to fasten solar cell connectors by means of ultrasonic welds to solar cell contacts (U.S. Pat. No. 3,620,847). The above-mentioned ultrasonic welding machines, in which a sonotrode is applied at a defined force by means of system-defined mechanisms, can be used for this purpose wherein an ultrasonic pulse is actuated and the further parameters such as welding time, contact pressure, contact surface and pulse amplitude are varied to produce the desired weld. To form a module of cells, with each single cell being either $5 \times 5$ or $10 \times 10$ cm$^2$, up to 16 individual steps per cell, i.e. individual welds, need to be made to interconnect the cells into a module. A particular drawback in this operation is that, in order to realize a mechanically perfect weld between contact and cell (an approximately 80 $\mu$ thick aluminum foil), the sonotrode must have a defined vibration amplitude. This amplitude, in conjunction with the required contact pressure force, causes the solar cells to vibrate as well at the vibration frequency of, e.g., 36 kHz, which then often leads to breaks in the solar cell. When welding the cells into modules, this involves, in addition to many rejects, considerably more manual work in connection with the module welding which is normally performed automatically.

SUMMARY OF THE INVENTION

It is an object of the present invention to provide an apparatus of the above-mentioned type which is distinguished by relatively simple design and permits a better mechanical and electrical weld connection between components in a continuous, rolled seam than was possible with the stepped weld seam produced on conventional devices.

The above and other objects are accomplished in accordance with the invention wherein an apparatus is provided for receiving components having overlapping surfaces and welding the components together with the use of ultrasound. Means are provided for supplying a high frequency current to an ultrasonic emitter. The ultrasonic emitter converts the high frequency current into mechanical ultrasonic vibrations having the same frequency. A transmitter transmits the ultrasonic vibrations to a sonotrode which focuses the ultrasonic vibrations on the components to be welded together. The sonotrode is provided with a circumferential collar and means are provided for lowering the collar during the welding process so that a part of the collar tangentially contacts the overlapping surface of one of the components. The part of the collar which tangentially contacts the overlapping surface introduces ultrasonic energy into the components. Means are provided for rotatably mounting the ultrasonic emitter, the transmitter and the sonotrode via a vibration node of the transmitter. Lastly, means are provided for rotating the sonotrode and moving the sonotrode relative to the components such that the collar rolls over the components during the welding process.

A significant advantage of the invention as compared with presently conventional devices, is the considerably reduced requirement for ultrasonic energy and a significantly lesser contact pressure force exerted by the sonotrode against the components to be welded together. Moreover, the rate of production is advantageously increased by the novel apparatus, as is the reliability and quality of the weld. When the present invention is used in connection with welds on solar cells, the result is, in addition to a reduction in manufacturing rejects, a reduction in the resistance losses in the contact connecting system, which leads to an increase in the electrical energy produced by the solar cell.

The applicability of the apparatus according to the invention is not, however, limited to weld connections between solar cell connectors and solar cell contacts. It may also be used for welds to join a plurality of foils to one another, as well as welds of foils to metal sheets or massive bodies, with the articles to be welded together being made, for example, of aluminum, gold, copper, nickel, silver, silicon or other metals.

DESCRIPTION OF THE PREFERRED EMBODIMENT

Figure 1:
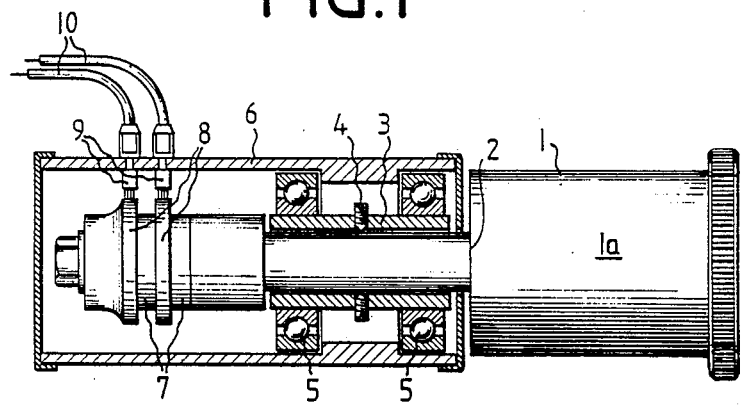
FIG. 1 is an elevational view, partly in cross section, of a device comprising an ultrasonic emitter, transmitter and sonotrode according to the invention.

FIG. 1 shows a sonotrode 1 coupled to a vibration converter including ultrasonic piezoceramic emitter 7 and transmitter 2. Transmitter 2 is fastened at the left frontal face of sonotrode 1 in a sleeve 3 by means of stud screws 4, and is connected at its left end with ultrasonic emitter 7 which converts high frequency current oscillations into mechanical ultrasonic vibrations. The ultrasonic emitter 7 is a well known disk-shaped arrangement. The physical foundations and properties of those ultrasonic emitters are described in the Valvo-Handbook, Piezoxide (PXE) 1979, Oct. 1978. The high frequency current oscillations are generated by a high frequency generator (not shown) and are transmitted via sliprings 8, brushes 9 and high frequency leads 10, to ultrasonic emitter 7. The mechanical ultrasonic vibrations produced by emitter 7 are transmitted to sonotrode 1 by transmitter 2. In one embodiment, components 2, 3, 4, 7, 8 and 9 are disposed in a spatially fixed housing 6, the outer walls of which are penetrated by high frequency leads 10. The inner walls of housing 6 serve as bearing elements for two ball bearing 5, in which sleeve 3 together with transmitter 2, sonotrode 1, ultrasonic emitter 7 and their associated components are rotatably mounted. Ball bearings 5 are located in a vibration node of transmitter 2 so as not to interfere with the vibrations of the system comprising ultrasonic emitter 7, transmitter 2 and sonotrode 1. The right end of transmitter 2 passes through the right frontal face of housing 6.

Figure 6A:
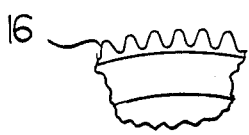
FIG. 6A is a side view showing a broken-away portion of a sonotrode collar.
Figure 6B:
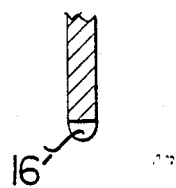
FIG. 6B and 6C are partial section views of alternative sonotrode collars.
Figure 6C:
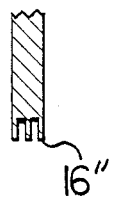

Sonotrode 1, which for example may have a cylindrically shaped main body 1a, has fixed at its outer right-hand end an annular collar 16 which acts as a welding wheel. The diameter of collar 16 exceeds the diameter of sonotrode main body 1a. The outer circumference of collar 16 may be smooth, corrugated or toothed. These designs are shown in FIG. 6A (a side view showing a broken-away portion of a collar 16) and FIGS 6B and 6C (partial sectional views of alternative collars 16' and 16"). A multiple corrugation or ribbing arrangement may be alternatively used along the circumference of collar 16.

The sonotrode 1 may be made of steel or titan, while the transmitter 2 can be a bar of titan. These elements are constructed so that the amplification is a raising of the amplitude.

Figure 2:
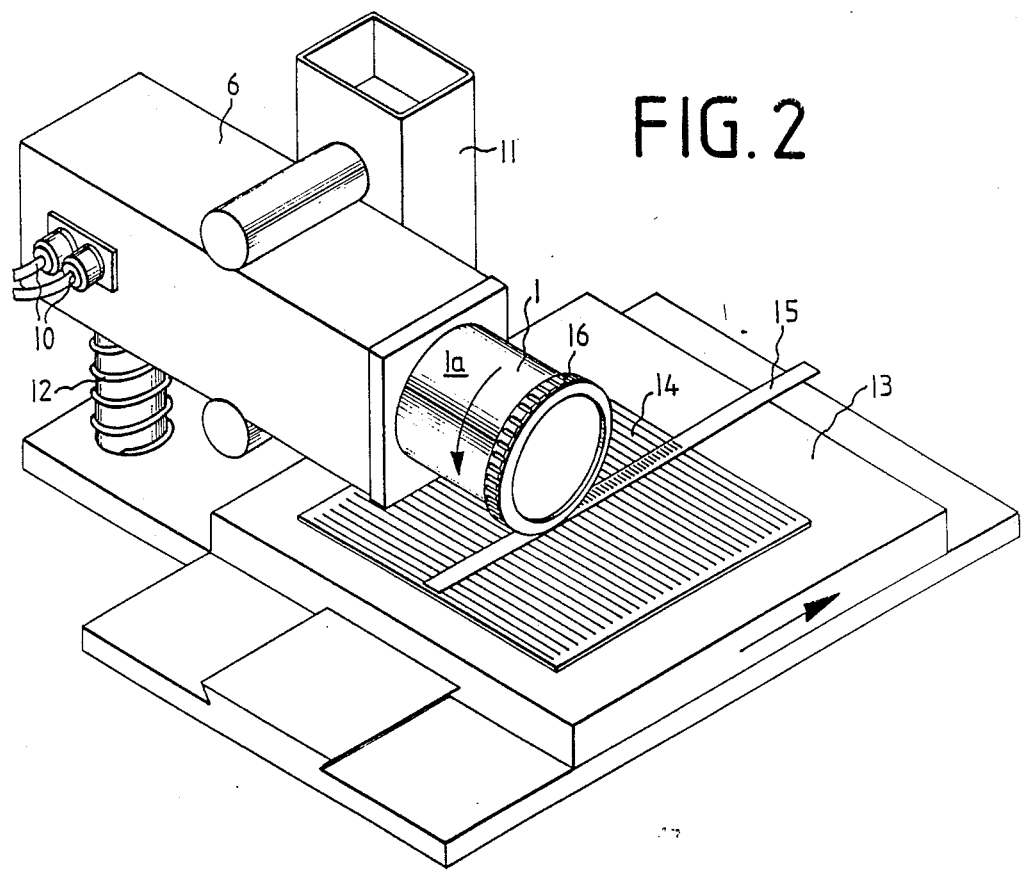
FIG. 2 is a perspective illustration of an apparatus according to the invention for making a rolled seam weld on solar cells using the device of FIG. 1.

Reference is made to FIG. 2 in which like components bear the same reference numerals as those employed in FIG. 1. Housing 6 is disposed in a housing support 11 about whose horizontal axis housing 6 is pivoted by means of a compression spring 12 to lower collar 16 onto the parts to be welded. In the illustrated embodiment, these parts are a contact welding tape 15 which is to be fastened directly to one side of a solar cell 14, with the solar cell being mounted on a movable member 13. During the welding process, collar 16 is lowered onto contact welding tape 15 and presses it to the upper face of solar cell 14 with a given contact pressure. A relative movement between collar 16 and components 14 and 15 causes sonotrode 1 together with collar 16 to be rolled over components 14 and 15, with only the part of collar 16 which tangentially contacts the contact welding tape 15 transmitting ultrasonic energy into components 14 and 15 to produce a weld at the corresponding points of contact. This produces a so-called rolled seam weld connection between solar cell 14 and contact welding tape 15.

The relative movement between collar 16 and components 14 and 15 is realized by displacement of table 13 in the direction of the arrow shown in FIG. 2. Sonotrode 1 together with collar 16 is fixed in space. The rotary movement of rotating collar 16 and sonotrode 1 together with ultrasonic emitter 7 and transmitter 2 (of FIG. 1) is produced by friction contact between collar 16 and components 14 and 15. The friction contact is established by the defined, settable spring force of spring 12.

Figure 3:
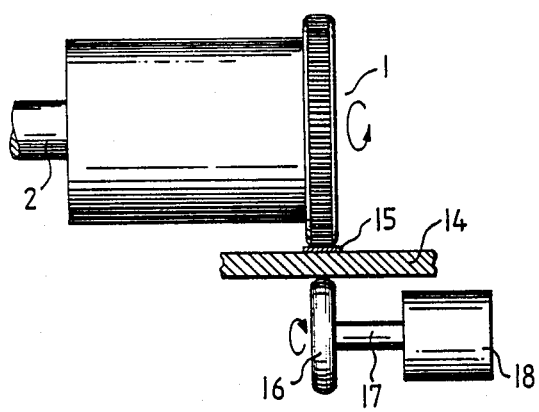
FIG. 3 is an elevational view of a device comprising a rotatably mounted drive roller in accordance with another embodiment of the invention and a drive motor coupled to said drive roller.
Figure 4:
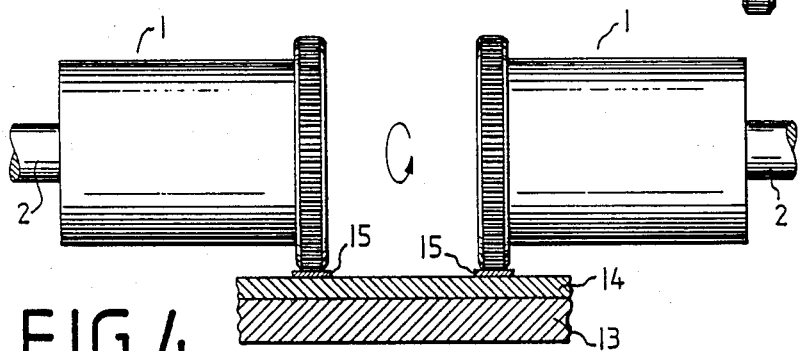
FIG. 4 is an elevational view of an apparatus comprising two sonotrodes for simultaneously welding components according to a further embodiment.

Such relative movement can also be generated by moving sonotrode 1 with rotating collar 16 over spatially fixed parts to be welded together. It is also possible to dispose drive rollers as rotatable abutments underneath the components, with such rollers being driven by a motor (FIG. 3). Moreover, it is further possible to have contact welding tape 15 move over a roller guide. This roller guide can be provided with a cutting device so that contact welding tape 15 can be cut to a given length. Additionally it is possible to weld the components by means of two or more devices simultaneously (FIG. 4). This can occur on both sides of the components (FIG. 5).

A shown in FIG. 3 a rotatably mounted drive roller 16 is disposed underneath a solar cell 14 and contact welding tape 15 for moving the components 14 and 15 relative to said sonotrode 1 and its collar. To the drive roller 16 is coupled a drive motor 18 via a shaft 17. In FIG. 3, as well as in FIGS. 4 and 5, like components bear the same reference numerals as those employed in FIGS. 1 and 2.

FIG. 4 shows an apparatus comprising two sonotrodes 1 which simultaneously weld the components 14 and 15. The sonotrodes are situated on one axis. The component 14 is arranged on a movable table 13.

Figure 5:
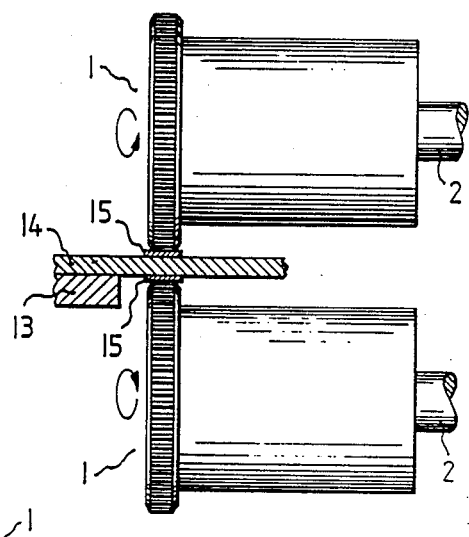
FIG. 5 is an elevational view of an apparatus comprising according to yet another embodiment of the invention two sonotrodes, which are disposed on each side of the components for welding.

In FIG. 5 the two sonotrodes 1 are disposed on each side of the component 14 which is arranged on a movable table 13. Two contact welding tapes 15 can be welded on the upper and lower face of the component 14 simultaneously.

It will be understood that the above description of the present invention is susceptible to various modifications, changes and adaptations, and the same are intended to be comprehended within the meaning and range of equivalents of the appended claims.

What is claimed is:

1. An apparatus for welding a conductive welding tape to a solar cell on which the tape is positioned, comprising:
   means for supplying a high frequency current;
   an ultrasonic emitter coupled to said high frequency current supply means for producing mechanical ultrasonic vibrations having a frequency corresponding to the frequency of the high frequency current;
   a transmitter coupled to said ultrasonic emitter for transmitting the ultrasonic vibrations;
   a sonotrode coupled to said transmitter and responsive to the transmitted ultrasonic vibrations for focussing the ultrasonic vibrations on the tape and solar cell, said sonotrode being provided with a circumferential collar having a periphery with corrugations;
   means coupled to said sonotrode for lowering said collar during the welding process so that said periphery of said collar tangentially contacts the tape, wherein only said periphery of said collar transfers ultrasonic energy to said tape and solar cell;
   means for rotatably mounting said ultrasonic emitter, said transmitter and said sonotrode and being located in at least one vibration node of said transmitter; and
   displacement means for effecting linear displacement of said sonotrode relative to the tape and cell in a direction parallel to a line that is tangent to said collar where said periphery of said collar contacts the tape, said collar being caused to roll over the tape during the welding process by a force that is transmitted exclusively through the cell and tape during such linear displacement,
   wherein the tangential contact between said collar and the tape is a friction contact, augmented by said corrugations on said periphery of said collar, and wherein the relative movement between said collar and the tape produced by said displacement means, combined with the friction contact therebetween, causes said sonotrode to rotate via said rotatable mounting means.

2. An apparatus as defined in claim 1 wherein said sonotrode is rotationally symmetrical.

3. An apparatus as defined in claim 1, wherein said sonotrode together with said collar are linearly movable, the tape and cell are stationary, and said displacement means comprises means for linearly moving said sonotrode together with said collar.

4. An apparatus as defined in claim 1, wherein said displacement means comprises means for linearly moving the tape and cell underneath said sonotrode and its collar, and said rotatable mounting means are stationary.

5. An apparatus as defined in claim 4, wherein said displacement means is a rotatably mounted drive roller disposed underneath the tape and cell for moving the tape and cell relative to said sonotrode and its collar.

6. An apparatus as defined in claim 5 further comprising a drive motor coupled to said drive roller.

7. Apparatus as defined in claim 1 wherein said means for lowering said collar includes an adjustable spring which produces a force defining the friction contact between said collar and the tape.

8. An apparatus as defined in claim 1 wherein said apparatus comprises at least two sonotrodes which simultaneously weld tapes to the cell.

9. An apparatus as defined in claim 8 wherein at least one said sonotrode is disposed on each side of the cell for welding tapes to both sides of the cell simultaneously.

10. An apparatus as defined in claim 1, wherein the welding tape is an elongated metal foil.

11. An apparatus for welding an elongated metal foil welding tape to a solar cell on which the tape is positioned, comprising:
    an ultrasonic emitter;
    an elongated transmitter having a first end and having a second end to which the ultrasonic emitter is connected, the transmitter having at least one vibration node;
    a sonotrode connected to the first end of the transmitter to focus ultrasonic vibrations, the sonotrode having a circumferential collar;
    a housing;
    means, located at the at least one vibration node of the transmitter, for rotatably mounting the emitter and transmitter in the housing, with the sonotrode extending out of the housing;
    means for supplying a high frequency current to the ultrasonic emitter;
    a support member mounted for movement along a linear path, the support member supporting the cell and the tape being positioned on the cell parallel to the path;
    means mounting the housing for pivoting movement so that the sonotrode collar is positioned to tangentially engage the tape and is pivotable toward and away from the tape, the means mounting the housing additionally including means for biasing the sonotrode collar toward the tape; and
    means for moving the support member along the path to carry the cell and tape past the sonotrode collar and to rotate the emitter, transmitter, and sonotrode exclusively through frictional engagement of the sonotrode collar with the tape,
    wherein the sonotrode collar has a corrugated periphery to increase the frictional engagement between the tape and the sonotrode collar.

12. An apparatus as in claim 11, wherein the corrugated periphery is a toothed periphery.

13. An apparatus as in claim 11, wherein the means mounting the housing comprises a support, an arm extending from the support and parallel to the path, the housing being carried by the arm and pivotable about the arm, and a spring spaced apart from the arm to bias the housing.

14. A method for welding an elongated metal foil welding tape to a solar cell, comprising the steps of:
    (a) placing the welding tape on the cell;
    (b) moving the cell and the tape placed thereon along a linear path which is parallel to the tape, the path running past an ultrasonic welding station which includes a rotatably mounted sonotrode having a circumferential collar with a corrugated periphery;
    (c) urging the sonotrode collar against the tape;
    (d) rolling the sonotrode collar over the tape using a force arising solely through frictional engagement between the sonotrode collar and the tape being augmented by the corrugated periphery of the sonotrode collar; and (e) vibrating the sonotrode ultrasonically to weld the tape to the cell as the sonotrode collar rolls over the tape.

15. The method of claim 14, wherein the ultrasonic welding station additionally includes a pivotably mounted housing on which the sonotrode is rotatably mounted, and wherein step (c) comprises biasing the housing to urge the sonotrode collar against the tape.

16. The method of claim 15, wherein the step of biasing the housing is conducted by exerting force on the housing with a spring.

* * * * *